United States Patent
Li et al.

(10) Patent No.: US 6,503,763 B2
(45) Date of Patent: Jan. 7, 2003

(54) METHOD OF MAKING MFMOS CAPACITORS WITH HIGH DIELECTRIC CONSTANT MATERIALS

(75) Inventors: Tingkai Li, Vancouver, WA (US); Sheng Teng Hsu, Camas, WA (US); Hong Ying, San Jose, CA (US); Bruce D. Ulrich, Beaverton, OR (US); Yanjun Ma, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/819,879

(22) Filed: Mar. 27, 2001

(65) Prior Publication Data

US 2002/0142487 A1 Oct. 3, 2002

(51) Int. Cl.[7] .............................................. H01L 21/00
(52) U.S. Cl. ........................................... 438/3; 257/295
(58) Field of Search ........................... 438/3, 240, 253; 257/295

(56) References Cited

U.S. PATENT DOCUMENTS

| | | | | |
|---|---|---|---|---|
| 5,940,682 | A | * 8/1999 | Tabara | 438/17 |
| 6,190,925 | B1 | 2/2001 | Li et al. | 483/3 |
| 6,236,076 | B1 | * 5/2001 | Arita et al. | 257/295 |
| 6,255,121 | B1 | * 7/2001 | Arita et al. | 438/3 |
| 6,316,797 | B1 | * 11/2001 | Van Buskirk et al. | 257/295 |
| 6,319,542 | B1 | * 11/2001 | Summerfelt et al. | 427/79 |

OTHER PUBLICATIONS

Article entitled "Oriented Lead Germanate Thin Films by Excimer Laser Ablation", by Peng et al., published in Appl. Phsy. Lett. 60 (7), Feb. 17, 1992, pp. 827–829

Article entitled, "Processing of a Uniaxial Ferroelectric Pb5Ge3O11 Thin Film at 450° C. with C–Axis Orientation" by Lee et al., published in Appl. Phys. Lett. 60(20), May 18, 1992, pp. 2487–2488.

Article entitled, Properties of Undoped and Doped Ferroelectric Lead Germanate Thin Films, by Schmitt et al., published in Ferroelectrics 56, (1984), pp. 141–144.

Article entitled, "Pulsed Excimer Laser Deposition of Ferroelectric Thin Films", by Krupanidhi et al., published in 3rd International Symposium on Integrated Ferroelectrics, pp. 100–115.

* cited by examiner

Primary Examiner—David Nelms
Assistant Examiner—Thao P Le
(74) Attorney, Agent, or Firm—David C. Ripma; Matthew D. Rabdau; Scott C. Krieger

(57) ABSTRACT

A MFMOS one transistor memory structure for ferroelectric non-volatile memory devices includes a high dielectric constant material such as $ZrO_2$, $HfO_2$, $Y_2O_3$, or $La_2O_3$, or the like, or mixtures thereof, to reduce the operation voltage and to increase the memory window and reliability of the device.

3 Claims, 6 Drawing Sheets

2Pr: 2.31 µC/cm²
2Ec: 30.8 KV/cm

2Pr: 2.91 µC/cm²
2Ec: 32.8 KV/cm

2Pr: 3.60 μC/cm²
2Ec: 28.4 KV/cm

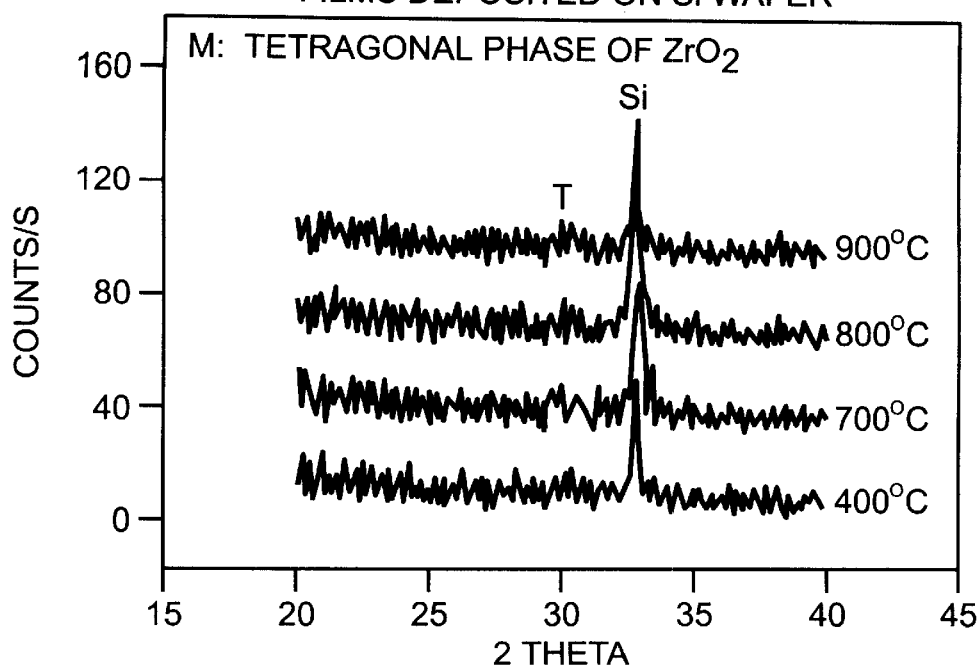
Fig. 11 THE X-RAY PATTERNS OF $ZrO_2$ THIN FILMS DEPOSITED ON Si WAFER
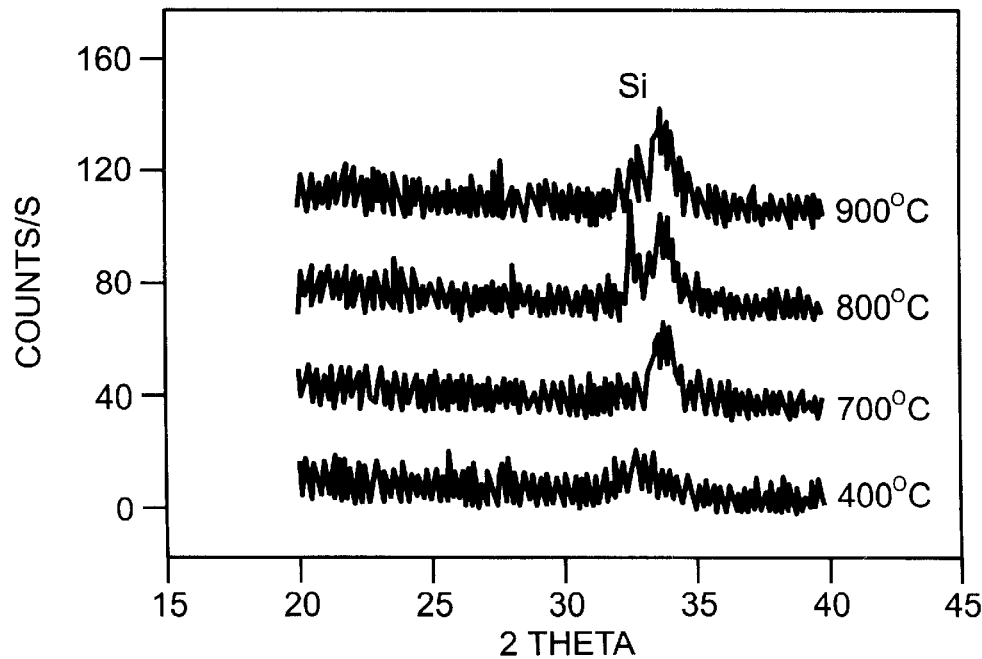
Fig. 12 THE X-RAY PATTERNS OF $HfO_2$ THIN FILMS DEPOSITED ON Si WAFER THE MEMORY WINDOW OF PGO MFMOS DEVICE WITH A 4 NM THICK $HfO_2$ THIN FILMS

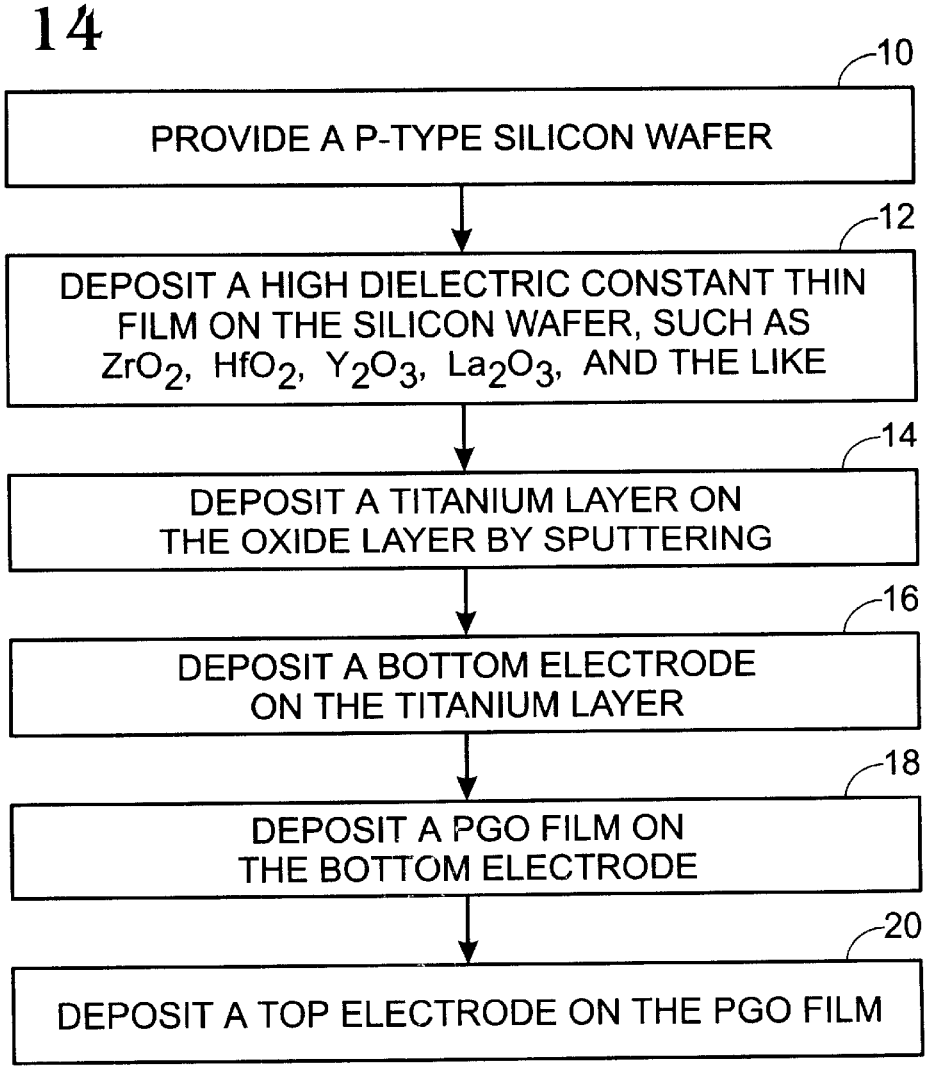

METHOD OF MAKING MFMOS CAPACITORS WITH HIGH DIELECTRIC CONSTANT MATERIALS

FIELD OF THE INVENTION

This invention relates to MFMOS one transistor memory structures and integrated processes for ferroelectric non-volatile memory devices and, more particularly, to MFMOS one transistor ferroelectric memory devices including high dielectric constant materials to reduce the operation voltage and to increase the memory window and reliability of the devices.

BACKGROUND OF THE INVENTION

Many one transistor ferroelectric memory devices, such as MFMOS, MFOS and MFMS, have been proposed. However, no reliable memory devices have been fabricated because of the difficulty in selecting appropriate ferroelectric and dielectric materials, and due to the integrated process technology required for the one transistor memory devices. Due to the difficulty in forming a ferroelectric-semiconductor interface with good electrical properties, the MFMOSFET memory cell has been selected as a good candidate for fabrication.

The basic operational principles for a MFMOSFET memory device are depicted in FIGS. 1 and 2. Referring to FIG. 1, when the ferroelectric material is poled towards the gate electrode, a positive compensation charge is induced at the channel surface. Under these conditions, the transistor is in the "off" state ("0" state) and the threshold voltage ($V_T$) is high. In contrast, referring to FIG. 2, when the ferroelectric material is poled towards the channel, a negative compensation charge is induced at the channel surface. Under these conditions, the transistor is in the "on" state ("1" state) and the threshold voltage is low. During the read operation, a sense amplifier detects the state of the MFMOSFET device. If there is a current, it is assigned a "1" value; if there is no current, it is assigned a "0" value. This is the basic operational mechanism of a MFMOS one-transistor memory device.

For MFMOS one-transistor memory devices, the operation voltage, memory window, and reliability parameters such as retention, are critical issues. The operation voltage ($V_{OP}$) for a MFMOS device is defined as $V_{OP}=V_O+V_F$ where $V_O$ and $V_F$ are the voltages applied on the oxide and the ferroelectric capacitor, respectively. In order to reduce the operation voltage and retain enough voltage to polarize the ferroelectric thin film, $V_O$ should be as small as possible. Due to the relationship $V_O=Q_O/C_O$ where $Q_O$ and $C_O$ are the electrical charge and the capacitance of the oxide capacitor, respectively, decreasing the thickness or increasing the dielectric constant of the gate insulator thin film will reduce $V_O$.

For a memory window, a plot of Log ($I_D$) (Drain current) versus $V_G$ (Gate voltage) for a MFMOSFET device is depicted in FIGS. 3 and 4. In the "0" state the device is non-conductive while in the "1" state the device is conductive. The essential condition for an n-channel one transistor memory device is that the threshold voltage of the device in the "0" state should be larger than the operating voltage, and the threshold voltage of the device in the "1" state should be larger than 0.0 V. As shown in FIG. 3, if $V_T$ in the "1" state is negative, a high leakage current ($I_D$) at $V_G=0$ will be observed.

The memory window of a MFMOS device is equal to $2Pr/C_{FE}$, where, Pr and $C_{FE}$ are the remnant polarization and capacitance of the ferroelectric capacitor, respectively. According to a typical sheet carrier density in the channel region of a MOSFET device, a remnant polarization value larger than 0.2 $\mu C/cm^2$ of the ferroelectric thin film is enough for ferroelectric-gate FET applications. It is virtually impossible to maintain a positive threshold voltage in the "1" state if the remnant polarization is too high. The maximum induced charge of a Silicon Dioxide ($SiO_2$) thin film is about 3.5 $\mu C/cm^2$ for an electric field of 10 MV/cm. The film breaks down at higher electrical fields. Therefore, in order to produce a reliable MFMOS device, one must select a ferroelectric material with a low dielectric constant, or increase the thickness of the ferroelectric thin film, which will result in a higher operation voltage.

Based on the mechanism of a MFMOS cell one-transistor memory device, the device will lose memory if depolarization occurs. Accordingly, the retention properties of the ferroelectric thin films are critical issues for one-transistor memory applications. The experimental results show that ferroelectric thin films with a saturated and square hysteresis loop and a large coercive field have excellent retention properties. However, a large coercive field also results in a higher operation voltage. In order make a reliable MFMOS one-transistor memory device, the ferroelectric thin film should have a saturated and square hysteresis loop, a low polarization value, a low dielectric constant, and an appropriate thickness and coercive field. For these reasons, ferroelectric $Pb_3Ge_5O_{11}$ (PGO) with a low polarization (Pr) value and dielectric constant has been selected for one transistor memory applications. The experimental results show that PGO MFMOS capacitors with a 3.5 nm thick $SiO_2$ layer exhibit high operation voltages. In order to reduce the operation voltage, one must either reduce the thickness of the $SiO_2$ layer or select high dielectric constant materials. Reducing the thickness of the $SiO_2$ layer has its limitations. Accordingly, there is a need for a high dielectric constant material for use in PGO MFMOS structure one transistor memory devices.

SUMMARY OF THE INVENTION

The assembly of the present invention provides a high dielectric constant material for MFMOS structure one transistor memory applications to reduce the operation voltage, and to increase the memory window and reliability of the device. In the preferred embodiments, the ferroelectric material comprises PGO and the high dielectric material comprises $ZrO_2$, $Y_2O_3$, $HfO_2$, $La_2O_3$, or the like, or mixtures thereof.

Accordingly, an object of the invention is to provide a reliable MFMOS device.

Another object of the invention is to provide a MFMOS device having a high dielectric material in order to reduce the operation voltage of the device.

A further object of the invention is to provide a MFMOS one transistor memory device wherein the ferroelectric thin film has a saturated and square hysteresis loop, a low polarization value, a low dielectric constant, and an appropriate thickness and coercive field.

BRIEF DESCRIPTION OF THE DRAWINGS

FIG. 11 is a plot of the X-ray patterns of $ZrO_2$ thin films deposited on a Si wafer at a variety of temperatures.

FIG. 12 is a plot of the X-ray patterns of $HfO_2$ thin films deposited on a Si wafer at a variety of temperatures.

FIG. 14 is a flowchart of the method of the present invention.

DETAILED DESCRIPTION OF THE PREFERRED EMBODIMENTS

Figure 1:
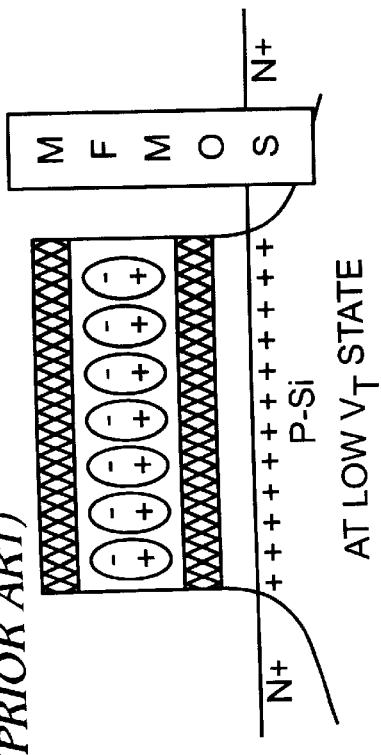
FIG. 1 is schematic of a MFMOSFET device showing the operation mechanism of the device when the ferroelectric material is poled toward the gate electrode.
Figure 2:
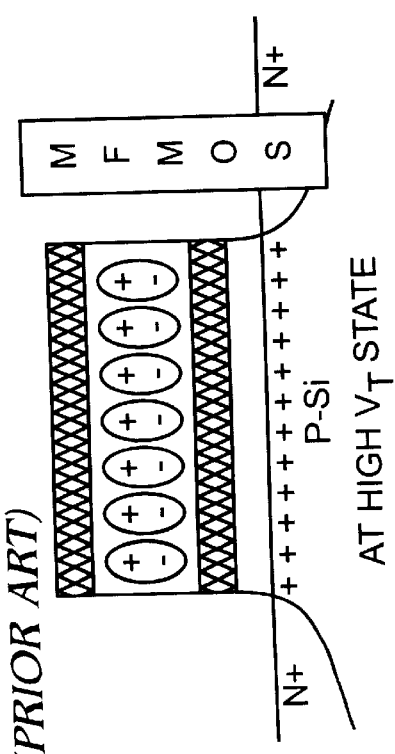
FIG. 2 is a schematic of a MFMOSFET device showing the operation mechanism of the device when the ferroelectric material is poled toward the channel.
Figure 3:
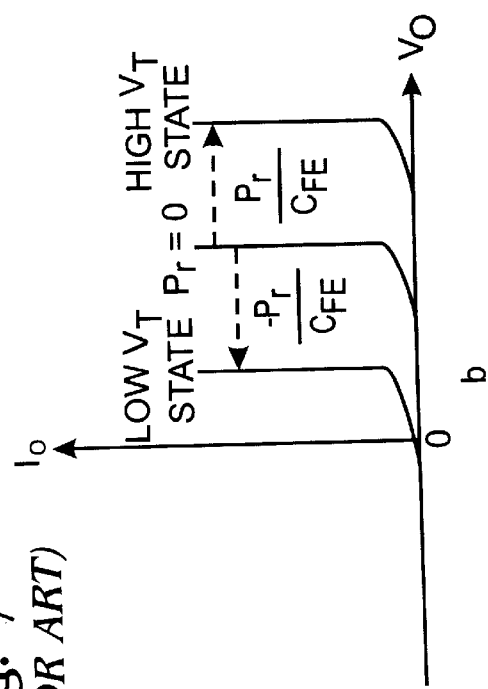
FIG. 3 is a plot of the drain current versus gate voltage of a MFMOSFET device wherein the threshold voltage ($V_T$) of the device in the "on" state is less than zero volts.
Figure 4:
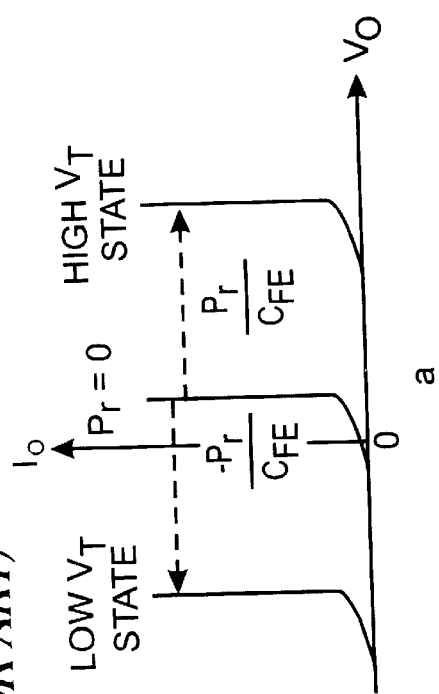
FIG. 4 is a plot of the drain current versus gate voltage of a MFMOSFET device wherein the threshold voltage ($V_T$) of the device in the "on" state is greater than zero volts.

The present invention provides a PGO MFMOS device, and a method of making the same, having high dielectric constant materials for one transistor memory applications. The operation voltage, memory window and reliability of the MFMOS structure one transistor memory device are improved over prior art devices. The detailed experimental methods and results are set forth below.

The Experimental Methods

A P-type Silicon (Si) wafer was used as the substrate for the metal ferroelectric metal oxide semiconductor (MFMOS) capacitor. In the first step, a 3.5 to 15 nm thin film of thermal $ZrO_2$, $HfO_2$, $Y_2O_3$, or $La_2O_3$, or the like, or a mixture thereof, was formed on the Si substrate. Each of these high dielectric materials has a dielectric constant of at least 10. A barrier layer of Titanium (Ti), approximately 10 to 20 nm thick, was deposited on the oxide layer by sputtering. After that, a bottom electrode (such as 20 to 150 nm thick Iridium (Ir)) was deposited on the Titanium layer by electrical beam evaporation techniques. An oxide metal organic chemical vapor deposition (MOCVD) reactor was then used for the growth of a 200 to 300 nm thick c-axis oriented $Pb_5Ge_3O_{11}$ (PGO) thin film on the Ir electrode. Finally, a top electrode (100 nm thick Platinum (Pt)) was deposited by electrical beam evaporation techniques. The pressure of the process typically is in the range of $2 \times 10^{-6}$ to $5 \times 10^{-7}$ torr, and the substrate temperature typically is approximately 225° C.

For the MOCVD process of depositing the PGO thin film, [Pb(thd)$_2$] and [Ge(ETO)$_4$] with a molar ratio of 5 to 5.5:3 was dissolved in a mixed solvent of butyl ether or tetrahydrofuran, isopropanol and tetraglyme in a molar ratio of 8:2:1. The precursor solutions had a concentration of 0.1 M/L of PGO. The solution was injected into a vaporizer with a temperature of 150 to 250° C. by a pump at a rate of 0.1 to 0.2 ml/min to form precursor gases. The growth line was 165 to 245° C. to keep the precursors in the gas phase. The MOCVD and annealing process conditions for the c-axis oriented PGO thin film are as follows: the deposition temperature and pressure were 350 to 450° C. and 5 torr; the Oxygen partial pressures were 30%; and the annealing temperature and time were 500 to 550° C. for one hour.

The phases of the films were identified using x-ray diffraction. The compositions of the $Pb_5Ge_3O_{11}$ films were analyzed using an ultra high resolution X-ray photoelectron Spectrometer (XPS). The leakage currents and capacitance of the PGO MFM and MFMOS capacitors were measured using a HP4155-6 precision semiconductor parameter analyzer and a Keithley 182 CV analyzer, respectively. The ferroelectric properties of the PGO MFM capacitors were measured with a standardized RT66A tester.

The Experimental Results

FIGS. 5 through 10 show the hysteresis loops of PGO MFM capacitors and the Capacitance-Voltage (C–V) curves of PGO MFMOS devices with various thicknesses of the $ZrO_2$ thin films. These figures show the values of the operation voltage and memory windows of the devices.

Figure 5:
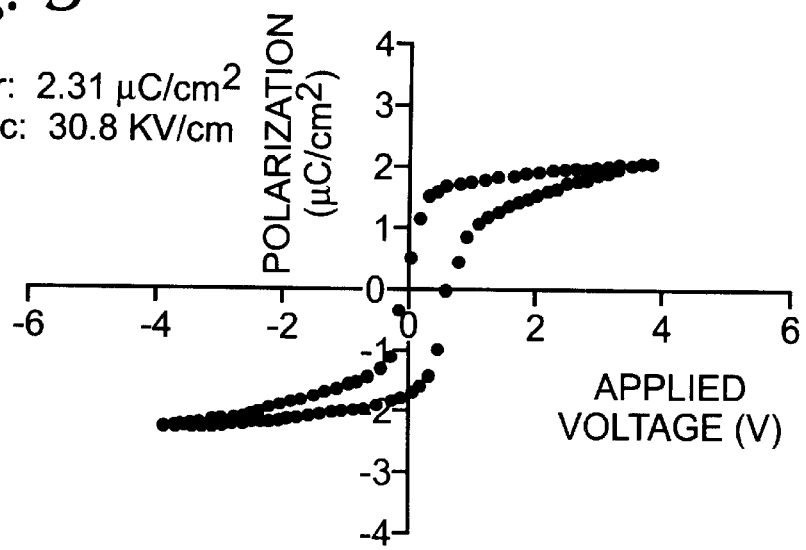
FIG. 5 is a plot of the hysteresis loop of a PGO MFMOS device with a 4 nm thick $ZrO_2$ thin film.

In particular, FIG. 5 is a plot of the hysteresis loop of a PGO MFMOS device with a 4 nm thick $ZrO_2$ thin film.

Figure 6:
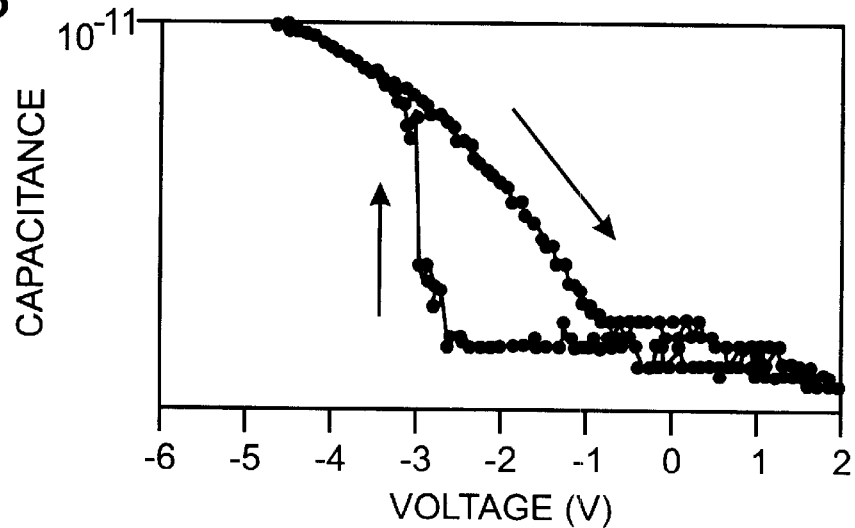
FIG. 6 is a plot of the memory window of a PGO MFMOS device with a 4 nm thick $ZrO_2$ thin film.

FIG. 6 is a plot of the memory window of a PGO MFMOS device with a 4 nm thick $ZrO_2$ thin film.

Figure 7:
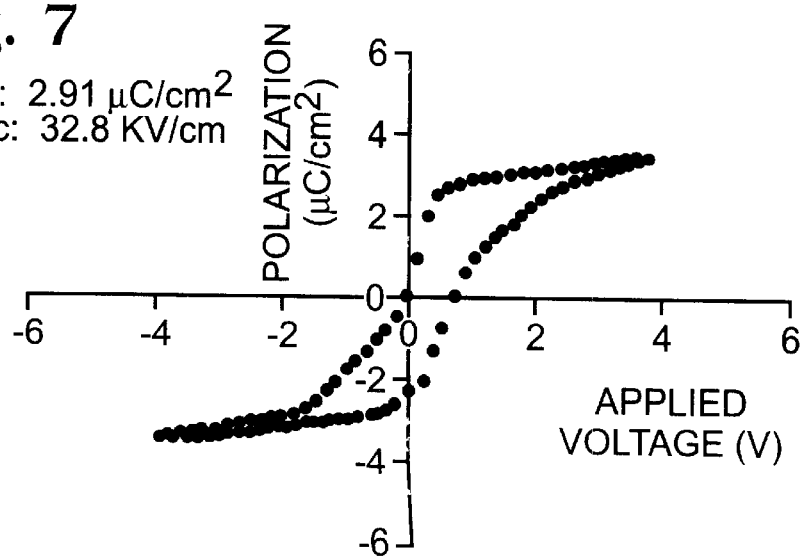
FIG. 7 is a plot of the hysteresis loop of a PGO MFMOS device with a 10 nm thick $ZrO_2$ thin film.

FIG. 7 is a plot of the hysteresis loop of a PGO MFMOS device with a 10 nm thick $ZrO_2$ thin film.

Figure 8:
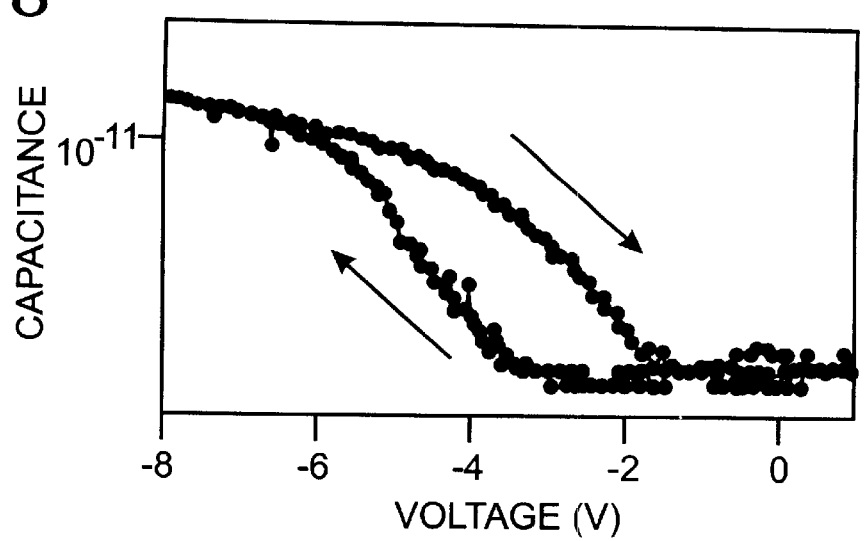
FIG. 8 is a plot of the memory window of a PGO MFMOS device with a 10 nm thick $ZrO_2$ thin film.

FIG. 8 is a plot of the memory window of a PGO MFMOS device with a 10 nm thick $ZrO_2$ thin film.

Figure 9:
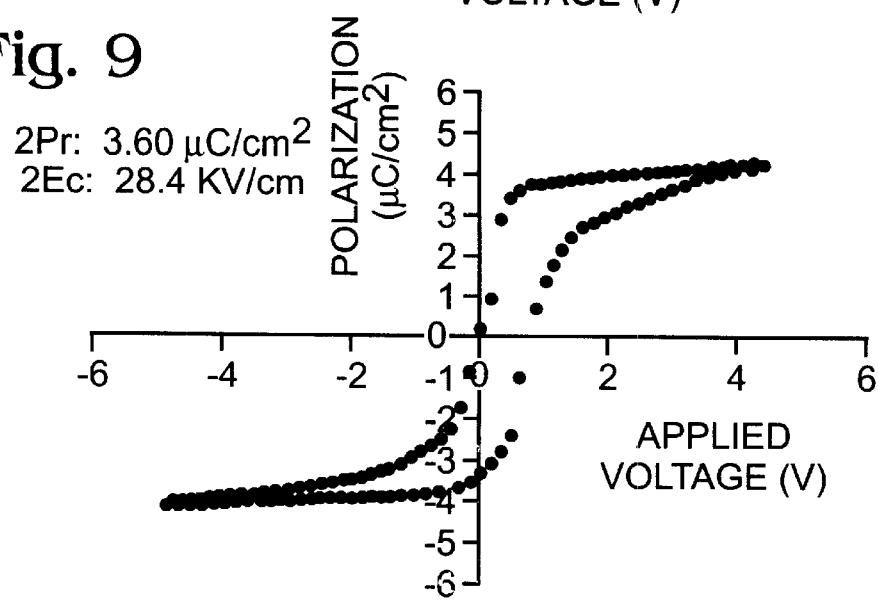
FIG. 9 is a plot of the hysteresis loop of a PGO MFMOS device with a 15 nm thick $ZrO_2$ thin film.

FIG. 9 is a plot of the hysteresis loop of a PGO MFMOS device with a 15 nm thick $ZrO_2$ thin film.

Figure 10:
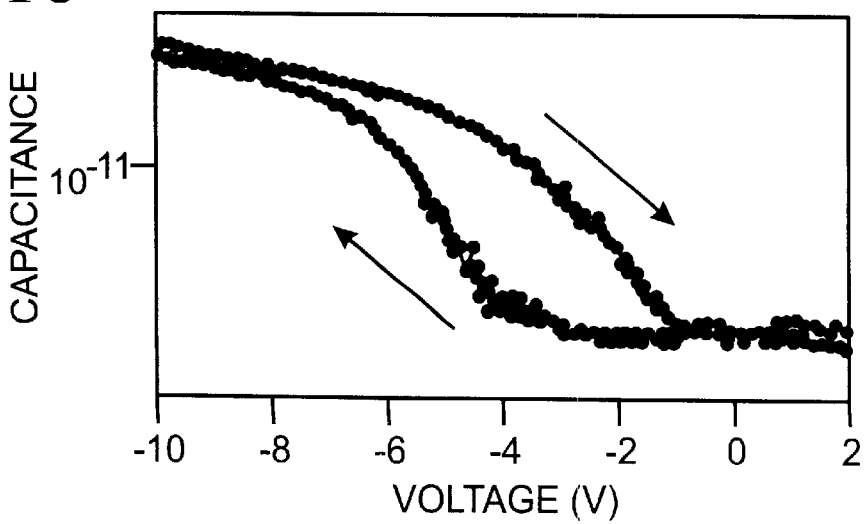
FIG. 10 is a plot of the memory window of a PGO MFMOS device with a 15 nm thick $ZrO_2$ thin film.

FIG. 10 is a plot of the memory window of a PGO MFMOS device with a 15 nm thick $ZrO_2$ thin film.

FIG. 11 is a plot of the X-ray patterns of $ZrO_2$ thin films deposited on a Si wafer at a variety of temperatures.

FIG. 12 is a plot of the X-ray patterns of $HfO_2$ thin films deposited on a Si wafer at a variety of temperatures.

Figure 13:
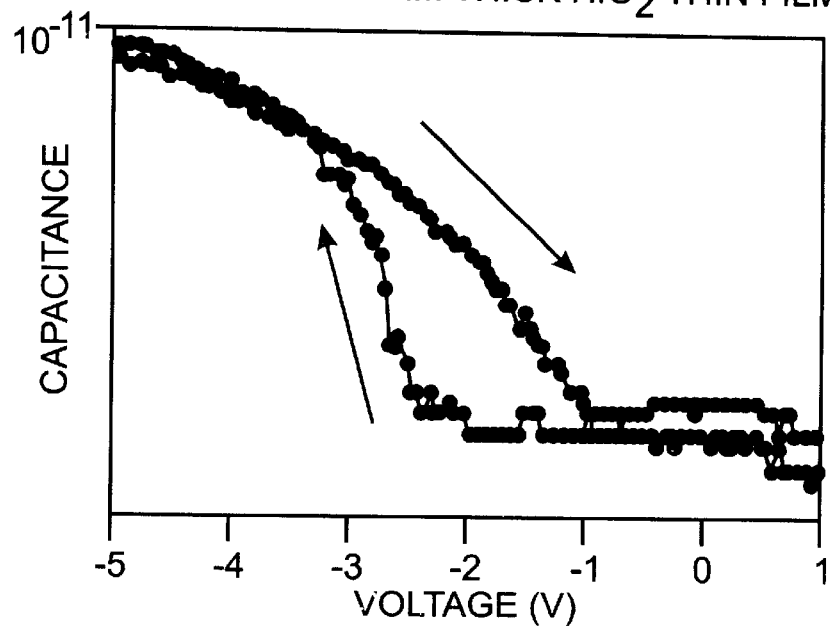
FIG. 13 is a plot of the memory window of a PGO MFMOS device with a 4 nm thick $HfO_2$ thin film.

FIG. 13 is a plot of the memory window of a PGO MFMOS device with a 4 nm thick $HfO_2$ thin film.

As shown by the figures, the device of the present invention, typically including an oxide layer of $ZrO_2$, defines a remnant polarization (2Pr) in a range of 2.31 to 3.6 $\mu C/cm^2$, and an electrical charge (2Ec) in a range of 28.4 to 32.8 KV/cm. Of course, these values are determined for a particular fabricated experimental device. These ranges, therefore, define merely an approximation of the ranges that are feasible for similarly fabricated devices as defined by the present invention.

The experimental results found by Applicants showed that the operation voltage of the device can be reduced by decreasing the thickness of the $ZrO_2$ thin film. The PGO MFMOS device with a $ZrO_2$ thin film also exhibited a large enough memory window for one transistor memory applications. The memory data found by these experimental results are consistent with the formulas and calculations performed. In particular, the calculated memory window value of a PGO MFMOS device is about 3.23 V, and the measured memory window values of the PGO MFMOS device range from 2.0 to 3.2 V, which is close to the calculated value.

According to the present invention, PGO MFMOS devices with high dielectric constant capacitors have been prepared using MOCVD and annealing processes. The memory windows of the PGO MFMOS were measured. The experimental results showed that the memory windows of the PGO MFMOS devices with $ZrO_2$ thin films capacitors were larger than 3 V, which is good enough for one transistor memory applications. Moreover, other high dielectric constant materials may also be utilized in the structure of the present invention, including $Y_2O_3$, $HfO_2$, $La_2O_3$, and the like, or mixtures thereof. These high dielectric constant materials also allowed for the fabrication of PGO MFMOS devices suitable for one transistor memory applications.

FIG. 14 is a flowchart of the method of the present invention. Step 10 comprises providing a P-type Silicon wafer. Step 12 comprises depositing a high dielectric constant thin film on the Silicon wafer, such as $ZrO_2$, $HfO_2$, $Y_2O_3$, or $La_2O_3$, or the like, or mixtures thereof. Step 14 comprises depositing a Titanium layer on the oxide layer by sputtering. Step 16 comprises depositing a bottom electrode on the Titanium layer. Step 18 comprises depositing a PGO film on the bottom electrode. Step 20 comprises depositing a top electrode on the PGO film. After these steps are completed, a MFMOS one transistor memory device having a high dielectric constant is provided.

Figure 15:
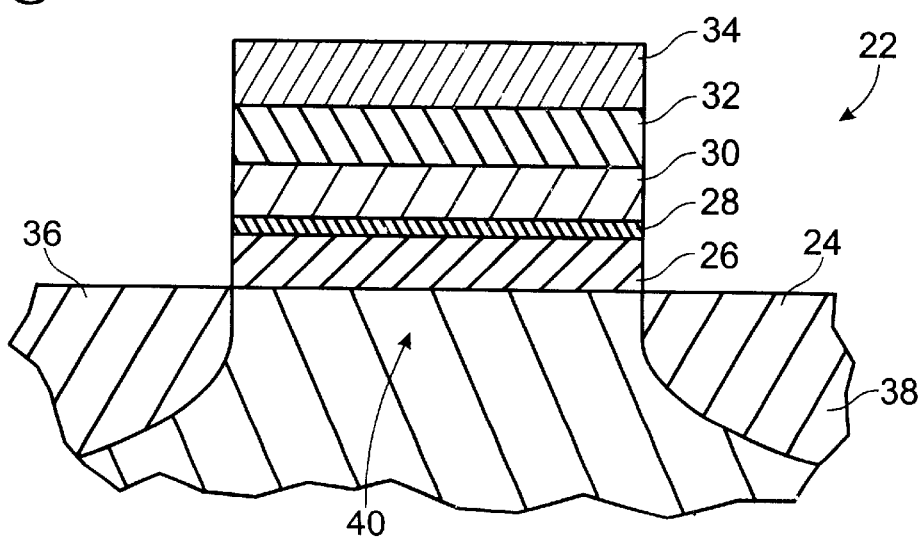
FIG. 15 is a schematic of a MFMOS device manufactured by the method of the present invention.

FIG. 15 shows a MFMOS device 22 as manufactured by the method of the present invention. Device 22 comprises a silicon substrate 24. An Oxide layer 26 manufactured of $ZrO_2$, $HfO_2$, $Y_2O_3$, $La_2O_3$, or the like, or mixtures thereof, is deposited on silicon substrate 24. A Titanium layer 28 is positioned on Oxide layer 26. A bottom electrode layer 30 is positioned on Titanium layer 28. A PGO ferroelectric layer 32 is positioned on bottom electrode 30. A top electrode 34 is positioned on ferroelectric layer 32. Substrate 24 may include a source region 36, a drain region 38 and a channel region 40, as known in the art.

Thus, a PGO MFMOS one transistor memory device having a high dielectric constant material, and a method of manufacturing the same, has been disclosed. Although preferred structures and methods of manufacturing the devices have been disclosed, it should be appreciated that further variations and modifications may be made thereto without departing from the scope of the invention as defined in the appended claims.

We claim:

1. A method of manufacturing a MFMOS one transistor memory device, comprising the steps of:

providing a semiconductor substrate;

depositing an oxide layer on said semiconductor substrate, said oxide layer comprising a material chosen from the group consisting of $ZrO_2$, $HfO_2$, $Y_2O_3$, and $La_2O_3$;

depositing a bottom electrode on said oxide layer; and depositing a PGO film on said bottom electrode.

2. The method of claim 1 further comprising depositing a barrier layer between said oxide layer and said bottom electrode layer and depositing a top electrode on said PGO film, and wherein said semiconductor substrate comprises P-type Silicon, wherein said barrier layer comprises Titanium, wherein said bottom electrode comprises Iridium, and wherein said top electrode comprises Platinum.

3. The method of claim 1 wherein said oxide layer comprises a material that defines a dielectric constant of at least 10.

* * * * *